United States Patent [19]
Duijves

[11] Patent Number: 4,912,431
[45] Date of Patent: Mar. 27, 1990

[54] CONTROL AMPLIFIER

[75] Inventor: Pieter W. G. Duijves, Hilversum, Netherlands

[73] Assignee: AT&T Bell Laboratories, Murray Hill, N.J.

[21] Appl. No.: 335,011

[22] Filed: Apr. 7, 1989

[30] Foreign Application Priority Data

Apr. 15, 1988 [NL] Netherlands .......................... 8800989

[51] Int. Cl.$^4$ .............................................. H03F 3/16
[52] U.S. Cl. ..................................... 330/300; 330/290
[58] Field of Search ............... 330/277, 278, 288, 290, 330/296, 300, 302

[56] References Cited

U.S. PATENT DOCUMENTS 3,974,456  8/1976  Russell et al. ........................ 330/300

FOREIGN PATENT DOCUMENTS 0660196  4/1979  U.S.S.R. ............................... 330/300

Primary Examiner—Steven Mottola
Attorney, Agent, or Firm—Peter Visserman

[57] ABSTRACT

A control amplifier enabling large bandwidths ($\approx 2$ GHz) and a large dynamic control range ($\approx 25$ dB). The amplifying element is a MESFET. This MESFET is automatically biased. Thus, FET's whose pinch-off voltage is subject to a large variation can be used without further adjustments.

2 Claims, 1 Drawing Sheet

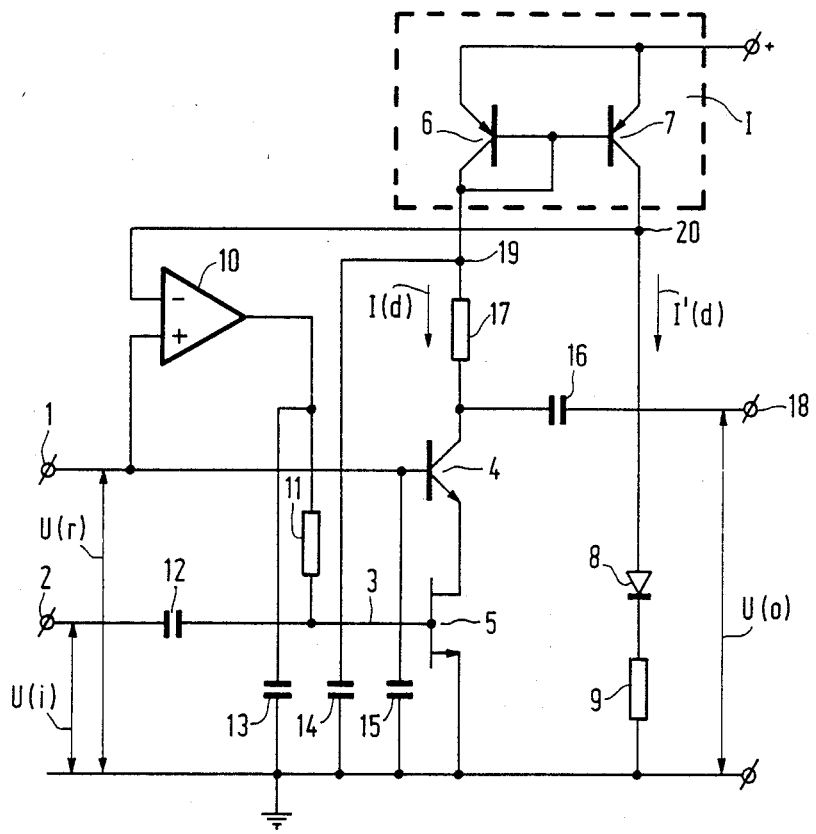

CONTROL AMPLIFIER

The invention relates to a control amplifier, comprising a first and a second transistor, this amplifier having its main current paths arranged in series, the control electrode of the first transistor being coupled to the signal input of the control amplifier, the control electrode of the second transistor being coupled to the control input of the control amplifier and the collector of the second transistor being coupled to the output of the control amplifier.

BACKGROUND OF THE INVENTION

Such amplifiers are used for automatic attenuation of telephone cables or in receivers of wideband optical systems for automatically compensating the attenuation depending on length and temperature in optical junctions in an optical transmission system.

A known control amplifier of this type is, for example, described in Dutch Patent Application No. 79 80411 (=PHN 9630). The collector of the second transistor is coupled on one side via a resistor to the output of the control amplifier and on the other side via a resistor to a point of constant potential. The output of the control amplifier is coupled to the emitter of the second transistor via the collector-emitter path of a third transistor. The control electrode of the third transistor is coupled to a reference voltage source. The magnitude of the control range of this known amplifier is determined by the resistances of the two resistors and is equal to $$A = 20 \cdot \log \frac{R(1) + R(2)}{R(1)}, \quad (1)$$

where A is the control range, R(1) the resistance of the resistor which is coupled to the point of constant potential and R(2) is the resistance of the resistor which is coupled to the output of the amplifier. The maximum value of R(2) is restricted by the capacitance of the collector of the second transistor, which capacitance also determines the maximum frequency at which the amplifier can still be used. Another restricting factor is the minimum value of R(1). The resistor R(1) coupled to the point of constant potential, unavoidably has a parasitic self-induction, owing to which the output voltage of the amplifier will enhance according as the frequency is increased, if the impedance of the parasitic self-induction is not small relative to R(1). In view of the foregoing, R(1)=10Ω and R(2)=90Ω are customary values at a maximum frequency of approximately 700 MHz. Substituting these values in the given expression (1) teaches us that the maximum control range is equal to 20 dB.

SUMMARY OF THE INVENTION

The invention has for its object to provide measures with which the maximum frequency and hence the bandwidth are enhanced with a control range which depends on the required bandwidth. The invention is characterized in that the first transistor is formed by a MESFET-transistor, the collector of the second transistor being coupled to the input of a current mirror circuit whose output is coupled on the one side to the inverting input of a comparator and on the other side via an impedance to a point of constant potential, the non-inverting input of the comparator being coupled to the control input of the control amplifier and the output of the comparator being coupled to the signal input of the control amplifier. The invention will now be described with reference to the FIGURE.

DETAILED DESCRIPTION

In the FIGURE, the first transistor is formed by a MESFET-transistor 5, whose discharge electrode is coupled to earth and whose source electrode is coupled to the emitter of the second transistor 4. The signal input 2 of the amplifier is coupled via the capacitor 12 to the control electrode 3 of the first transistor 5. The control input 1 is coupled to the control electrode of the second transistor 4 and also via the capacitor 15 to earth. Via the capacitor 16 the collector of this second transistor 4 is coupled to the output 18 of the control amplifier and also via the resistor 17 to the input 19 of a current mirror circuit I, formed by the transistors 6 and 7. The input 19 of the current mirror circuit I is coupled on the one side to the supply point (+) via the transistor 6 switched as a diode and on the other side to earth via the capacitor 14. The base of the transistor 6 is coupled to the base of the transistor 7, whose emitter-collector path is arranged between the supply point (+) and the output 20 of the current mirror circuit I. The output 20 of the current mirror circuit I is coupled to earth on the one side via the series arrangement of the diode 8 and the resistor 9 and on the other side to the inverting input of the comparator 10. The output of the comparator 10 is coupled via resistor 11 to the control electrode 3 of the firs transistor 5 and also via the capacitor 13 to earth. The non-inverting input of the comparator 10 is coupled to the control input 1 of the control amplifier.

The power gain of the control amplifier according to the invention is provided by the relationship:

$$U(o)/U(i) = g:R \quad (21)$$

where U(o) is the output power and U(i) is the input power of the control amplifier, g is the transconductance of the MESFET-transistor 5 and R is the resistance of resistor 17. The transconductance can be varied by varying the drain-source power of the transistor 5 and is provided by the relationship:

$$15g = dI(d)/dU(gs) \quad (3)$$

where I(d) is the drain current through the main current path of the transistor 5 and U(gs) is the gate-source power of the transistor 5. The drain-source power of the transistor 5 is adjusted by means of the control power U(r) and is approximately 0.7 Volt lower than this control power. This 0.7 Volt is equal to the junction power across the base-emitter diode of the transistor 4. Now it appears that with a varying drain-source power of the transistor 5 and with a constant gate-source power of the transistor 5 the drain current of the transistor 5 varies as well. The drain current of the transistor 5 is further also determined by the pinch-off voltage of this transistor. This pinch-off voltage is subject to a large variation, so that for each MESFET-transistor a different adjustment is required. The above renders it impossible to realize the bias adjustment of the transistor 5 by means of a simple feedback loop.

The bias adjustment of the transistor 5 in the embodiment of the invention is therefore realized by means of the current mirror circuit I, the comparator 10, diode 8 and the impedance 9. The gate voltage of the transistor 5 is now determined by the drain current of the transistor 5 as well as the control power at the input 1 of the control amplifier. The transistor 5 is adjusted in the linear portion of its transistor characteristic, the so-called resistance area. In this area it holds in good estimation that:

$$U(ds)/I(d)=R \qquad (3)$$

where R approximately depends on the gate-source voltage. A specific value is chosen for R and this value is also the resistance of resistor 9. This makes the relationship between current and voltage through resistor 9 equal to the relationship between current and voltage through the main current path of the transistor 5 and is maintained at the same level by means of the comparator 10 and the current mirror circuit I, as will be recognized presently. A control power U(r) is presented to the control input 1 of the control amplifier. This makes the drain-source voltage of transistor 5 equal to U(r)−0.7 Volt, in which 0.7 Volt is equal to the base-emitter voltage of transistor 4. The control power U(r) is also present at the output 20 of the current mirror circuit I, because the comparator 10 has the property to control such that the voltage between its two inputs (+ and −) is equal to 0 Volt, as a result of the feedback loop which is present between 20, I, 17, 4, 5, 11 and 10. The voltage across resistor 9 is then equal to U(r)−0.7 Volt, in which 0.7 Volt is the junction voltage of the diode 8. The voltage across resistor 9 is thus equal to the drain-source voltage of transistor 5. Now a current i (d) which is equal to the quotient of U(ds) and R, see relationship (3), will flow across resistor 9. This current is reflected as the drain current I(d) by means of the current mirror circuit I, which current is equal to the current I'(d) across resistor 9. The comparator 10 applies a bias voltage to gate 3 of the transistor 5 so that relationship (3) is satisfied, independent of the value of the pinch-off voltage of transistor 5.

Basically, the gain of the control amplifier can be adjusted back to a gain of ≈0, because the transconductance for U(ds)→0 also approaches 0. In practice the bandwidth then turns out to decrease as regards transfer. A control range of 25 dB with a 3 dB bandwidth of 1.5 GHz appears to be attainable with the control amplifier according to the invention. There is no defined lower bound for the gain. This lower bound is determined by the gain at which the deviation in the transfer is considered to be just permissible. The upper bound of the gain is determined by the product of the transconductance and the resistance R, compare relationship (2).

Optional values for the resistors and capacitors are, for example:

R(9)=140 Q

R(11)=50 Q

R(17)=50 Q

C(12)=C(13)=C(14)=C(15)=C(16)=10 nF

What is claimed is:

1. A control amplifier, comprising a first and a second transistor, this amplifier having its main current paths arranged in series, a control electrode of the first transistor being coupled to a signal input of the control amplifier, a control electrode of the second transistor being coupled to a control input of the control amplifier and a collector of the second transistor being coupled to an output of the control amplifier, characterized in that the first transistor is formed by a MESFET-transistor, the collector of the second transistor being coupled to the input of a current mirror circuit whose output is coupled on the one side to an inverting input of a comparator and on the other side via an impedance to a point of constant potential, an non-inverting input of the comparator being coupled to the control input of the control amplifier and the output of the comparator being coupled to the signal input of the control amplifier.

2. A control amplifier as claimed in claim 1, characterized in that the impedance is formed by a series arrangement of a diode and a resistor.

* * * * *